US011215686B2

(12) United States Patent
Sorte et al.

(10) Patent No.: US 11,215,686 B2
(45) Date of Patent: Jan. 4, 2022

(54) PROBE FOR OPERANDO IN SITU ELECTROCHEMICAL NUCLEAR MAGNETIC RESONANCE SPECTROSCOPY

(71) Applicants: National Technology & Engineering Solutions of Sandia, LLC, Albuquerque, NM (US); Mark S. Conradi, Albuquerque, NM (US)

(72) Inventors: Eric Glenn Sorte, Albuquerque, NM (US); Mark S. Conradi, Albuquerque, NM (US); Brennan J. Walder, Albuquerque, NM (US); Todd M. Alam, Cedar Crest, NM (US)

(73) Assignees: National Technology & Engineering Solutions of Sandia, LLC, Albuquerque, NM (US); ABQMR, Inc., Albuquerque, NM (US)

( * ) Notice: Subject to any disclaimer, the term of this patent is extended or adjusted under 35 U.S.C. 154(b) by 0 days.

(21) Appl. No.: 17/165,099

(22) Filed: Feb. 2, 2021

(65) Prior Publication Data
US 2021/0318401 A1   Oct. 14, 2021

Related U.S. Application Data

(60) Provisional application No. 63/058,187, filed on Jul. 29, 2020, provisional application No. 63/000,147, filed on Mar. 26, 2020.

(51) Int. Cl.
*G01R 33/46* (2006.01)
*G01N 24/12* (2006.01)

(52) U.S. Cl.
CPC ........ *G01R 33/4616* (2013.01); *G01N 24/12* (2013.01)

(58) Field of Classification Search
CPC ............................ G01N 24/12; G01R 33/4616
See application file for complete search history.

(56) References Cited

U.S. PATENT DOCUMENTS

| 8,310,235 B1 * | 11/2012 | Gerald, II | G01N 24/08 324/321 |
| 8,542,017 B2 * | 9/2013 | Aerts | A61B 5/0806 324/322 |

OTHER PUBLICATIONS

Gerald, R D II et al., "In Situ Nuclear Magnetic Resonance Investigations of Lithium Ions in Carbon Electrode Materials Using a Novel Detector," Journal of Physics: Condensed Matter, 2001, vol. 13, pp. 8269-8285.
Key, B. et al., "Real-Time NMR Investigations of Structural Changes in Silicon Electrodes for Lithium-Ion Batteries," Journal of the American Chemical Society, 2009, vol. 131, pp. 9239-9249.

(Continued)

*Primary Examiner* — Jay Patidar
(74) *Attorney, Agent, or Firm* — Kevin W. Bieg (57) ABSTRACT

Electrochemical devices with metal casings have been considered incompatible with nuclear magnetic resonance (NMR) spectroscopy because the oscillating magnetic fields ("rf fields") responsible for excitation and detection of NMR active nuclei do not penetrate metals. According to the present invention, rf fields can still efficiently penetrate into nonmetallic layers of electrochemical cells (such as a coin cell battery configuration) provided the magnetic field is oriented tangentially to the electrochemical cell electrodes in a "skimming" orientation. As an example, noninvasive high field in situ $^7$Li and $^{19}$F NMR of an unmodified commercial off-the-shelf rechargeable coin cell was demonstrated using a traditional external NMR coil setup. The in operando NMR measurements revealed that irreversible physical changes accumulate at the anode during electrochemical cycling.

12 Claims, 8 Drawing Sheets

(56) References Cited

OTHER PUBLICATIONS

Blanc, F. et al., "In Situ Solid-State NMR Spectroscopy of Electrochemical Cells: Batteries, Supercapacitors, and Fuel Cells," Accounts of Chemical Research, 2013, vol. 46, pp. 1952-1963.

Mohammadi, M. and Jerschow, A. "In Situ and Operando Magnetic Resonance Imaging of Electrochemical Cells: A Perspective," Journal of Magnetic Resonance, 2019, vol. 308, 106600, 8 pages.

Pecher, O. et al., "Materials' Methods: NMR in Battery Research," Chemistry of Materials, 2017, vol. 29, pp. 213-242.

Kayser, S. A. et al., "Long-Run in Operando NMR to Investigate the Evolution and Degradation of Battery Cells," Physical Chemistry Chemical Physics, 2018, vol. 20, pp. 13765-13776.

Romanenko, K. et al., "Accurate Visualization of Operating Commercial Batteries Using Specialized Magnetic Resonance Imaging with Magnetic Field Sensing," Chemistry of Materials, 2020, vol. 32, pp. 2107-2113.

Sorte, E. G. et al., "In Situ Stripline Electrochemical NMR for Batteries," ChemElectroChem, 2018, vol. 5, pp. 2336-2340.

Benders, S. et al., "Nuclear magnetic resonance spectroscopy of rechargeable pouch cell batteries: beating the skin depth by excitation and detection via the casing," Scientific Reports, 2020, vol. 10, 13781, 7 pages.

Conradi, M. S. and Zens, A. P. "Circuit Filling Factor (CFF) for Multiply Tuned Probes, Revisited," Journal of Magnetic Resonance, 2018, vol. 292, pp. 53-58.

Hoult, D. I. and Richards, R. E. "The Signal-to-Noise Ratio of the Nuclear Magnetic Resonance Experiment, Journal of Magnetic Resonance," 1976, vol. 24, pp. 71-85.

\* cited by examiner

PROBE FOR OPERANDO IN SITU ELECTROCHEMICAL NUCLEAR MAGNETIC RESONANCE SPECTROSCOPY

CROSS-REFERENCE TO RELATED APPLICATIONS

This application claims the benefit of U.S. Provisional Application No. 63/000,147, filed Mar. 26, 2020, and U.S. Provisional Application No. 63/058,187, filed Jul. 29, 2020, both of which are incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to operando in situ monitoring of electrochemical cells and devices, in particular, to a probe for operando in situ electrochemical nuclear magnetic resonance spectroscopy.

BACKGROUND OF THE INVENTION

Monitoring real time chemical and physical changes of electrochemical devices including batteries, fuel cells, supercapacitors and electrochemical sensors will be crucial for improving the performance, reliability, and sustainability of future device chemistries. See C. P. Grey and J. M. Tarascon, *Nat. Mater.* 16, 45 (2017). Nuclear magnetic resonance (NMR) spectroscopy carries rich chemical information and is conventionally noninvasive, which has led to the emergence of in situ and in operando NMR methods for observing battery chemistry. See R. E. Gerald II et al., *J. Phys.-Condens. Mat.* 13, 8269 (2001); B. Key et al., *J. Am. Chem. Soc.* 131, 9239 (2009); F. Blanc et al., *Accounts Chem. Res.* 46, 1952 (2013); and M. Mohammadi and A. Jerschow, *J. Magn. Reson.* 308, 106600 (2019). Yet in situ battery NMR has failed to gain traction outside of academic settings due to a great limitation: oscillating magnetic fields, such as the megahertz radiofrequency (rf) magnetic fields responsible for excitation and detection of high field NMR signals, do not penetrate a metallic bulk. Currently, in situ NMR avoids cells with metal casings, instead using specialty cells with mesh current collectors and small electrodes to minimize the amount of the metal within the cell. See O. Pecher et al., *Chem. Mater.* 29, 213 (2017); and S. A. Kayser et al., *Phys. Chem. Chem. Phys.* 20, 13765 (2018). These cells cycle and age differently than cells that are used in real-world applications. Coin cells with metal casings are the research and development standard for testing battery cycling performance and evaluating new formulations, but for these cells, in situ NMR has never been done on account of the rf penetration problem. This problem has been managed (but not overcome) for batteries with metal casings by "inside-out" magnetic resonance imaging (ioMRI) or internal rf circuitry, but ioMRI lacks chemical resolution and internal circuitry requires customizing the build for NMR. See K. Romanenko et al., *Chem. Mater.* 32, 2107 (2020); and E. G. Sorte et al., *ChemElectroChem* 5, 2336 (2018). A promising approach has recently been reported where the casing of an unmodified commercial pouch cell was harnessed as part of the NMR circuit to drive the electrodes as an internal rf coil, but the performance of this electrode NMR design is not yet close to a level which is practical for detailed chemical studies. See S. Benders et al., *Sci. Rep.-U.K.* 10, 1 (2020).

Therefore, a need remains for sensitive, chemically resolved, noninvasive NMR of batteries, such as unmodified coin cells with metal casings, using an external NMR coil.

SUMMARY OF THE INVENTION

The present invention is directed to a probe for operando in situ electrochemical nuclear magnetic resonance spectroscopy, comprising a transmission line coil comprising two anti-parallel planar conductors for inserting an electrochemical cell therebetween, the electrochemical cell comprising substantially planar parallel electrodes with an electrically insulating gap therebetween, wherein the transmission line coil is configured to apply a rf magnetic field tangentially to the parallel electrodes of the electrochemical cell when a pulsed rf excitation signal from an NMR spectrometer is applied to the transmission line coil, thereby allowing the rf magnetic field to at least partially penetrate into the gap; and a tuned circuit for matching the pulsed rf excitation signal from the NMR spectrometer to the transmission line coil. The electrochemical cell can comprise a battery, fuel cell, supercapacitor, or electrochemical sensor. For example, the battery can comprise a coin cell, pouch cell, or prismatic cell battery. For example, the transmission line coil can comprise a folded ribbon resonator or a flattened solenoid coil. The penetrating rf magnetic field can excite one or more NMR active nuclei in the gap of the electrochemical cell including, but not limited to, $^{1}H$, $^{2}H$, $^{3}H$, $^{6}Li$, $^{7}Li$, $^{10}B$, $^{11}B$, $^{13}C$, $^{15}N$, $^{19}F$, $^{23}Na$, $^{25}Mg$, $^{27}Al$, $^{31}P$, $^{51}V$, $^{17}O$, or $^{133}Cs$. The tuned circuit can comprise a double resonance circuit for tuning a low-frequency mode and a high-frequency mode of a pair of NMR active nuclei, such as [$^{1}H$, $^{7}Li$], [$^{1}H$, $^{6}Li$], [$^{19}F$, $^{6}Li$], [$^{19}F$, $^{7}Li$], [$^{1}H$, $^{31}P$], [$^{19}F$, $^{31}P$], [$^{1}H$, $^{11}B$], or [$^{19}F$, $^{11}B$].

The invention uses a tangentially applied (i.e., "skimming") magnetic field to circumvent the limitation of internal metallic components that would otherwise screen the oscillating rf magnetic field responsible for excitation and detection of NMR active nuclei. As an example, the probe was used for in operando NMR measurement of an unmodified commercial coin cell battery during electrochemical cycling. With the invention, in situ and in operando NMR of electrochemical cells in their native form factors enables noninvasive chemical analysis for a wide variety of cell chemistries. Therefore, the invention can provide a diagnostic tool for simple, noninvasive evaluation of electrochemical cell health.

BRIEF DESCRIPTION OF THE DRAWINGS

The detailed description will refer to the following drawings, wherein like elements are referred to by like numbers.

DETAILED DESCRIPTION OF THE INVENTION

Figure 1:
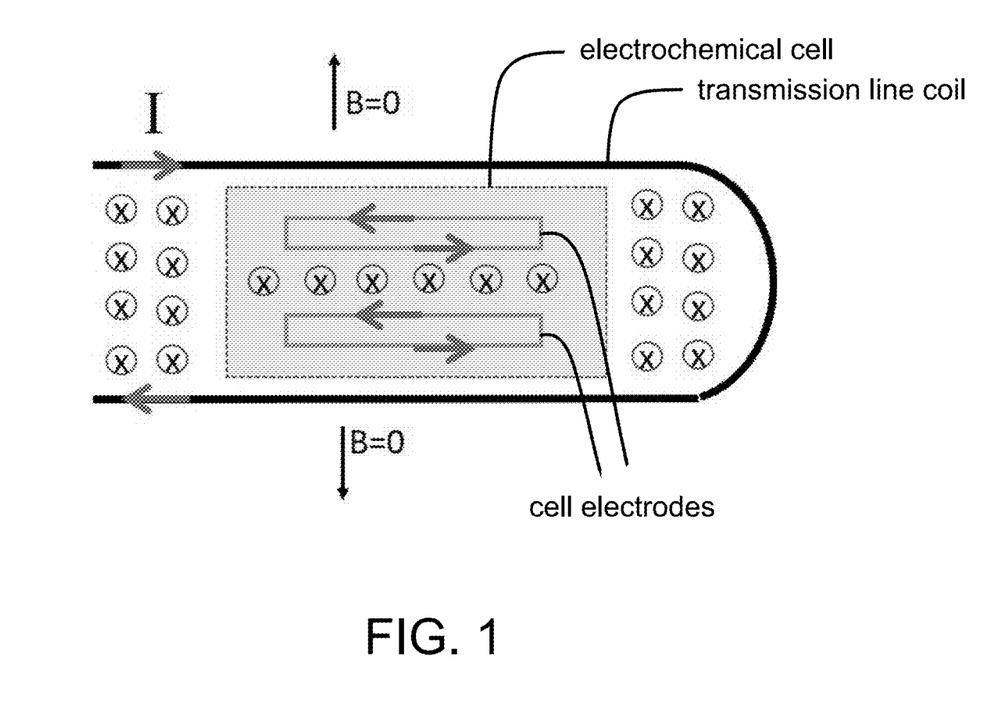
FIG. 1 is a side-on illustration of a shorted transmission line coil surrounding two opposing parallel electrodes of an electrochemical cell, wherein the rf magnetic field is applied tangential to the parallel electrodes. Surface currents are indicated by arrows. The ⊗ symbols represent the total oscillating field, showing good penetration into the gap between the electrodes.

The present invention is directed to an apparatus and method to achieve sensitive, chemically resolved, noninvasive operando NMR of electrochemical devices including, batteries, fuel cells, supercapacitors, and electrochemical sensors, in functional, unmodified cell form factors using an external NMR probe coil to achieve a rf magnetic field inside the cell. In FIG. 1 is shown a shorted transmission line coil and a flat electrochemical cell (e.g., a coin cell) comprising two conducting electrodes (e.g., anode and cathode), positioned between the anti-parallel planar conductors of the transmission line coil. The electrodes are surrounded by the cell casing, shown as a dotted line. When a rf magnetic field is applied to the electrodes via a rf current flowing anti-parallel in the electromagnetic transmission line coil conductors, eddy currents flow along the surfaces of the conducting cell electrodes, as shown, to exclude B-field from the metallic bulk of each of the electrodes. Therefore, the rf B-field penetrating into the gap between the two electrodes (the ⊗ symbols represent the total oscillating field) is the same as if the electrodes were not there. This is the desired result, with the original internal field of the transmission line coil passing in the gap between the two electrodes, where the nuclei of interest can be excited and detected (by reciprocity). Note that the direction of the B-field is crucial here. A B-field directed perpendicular to the electrode(s) would be fully screened by the electrodes, while the B-field tangential to the electrode(s) passes unabated into the cell.

Figure 2:
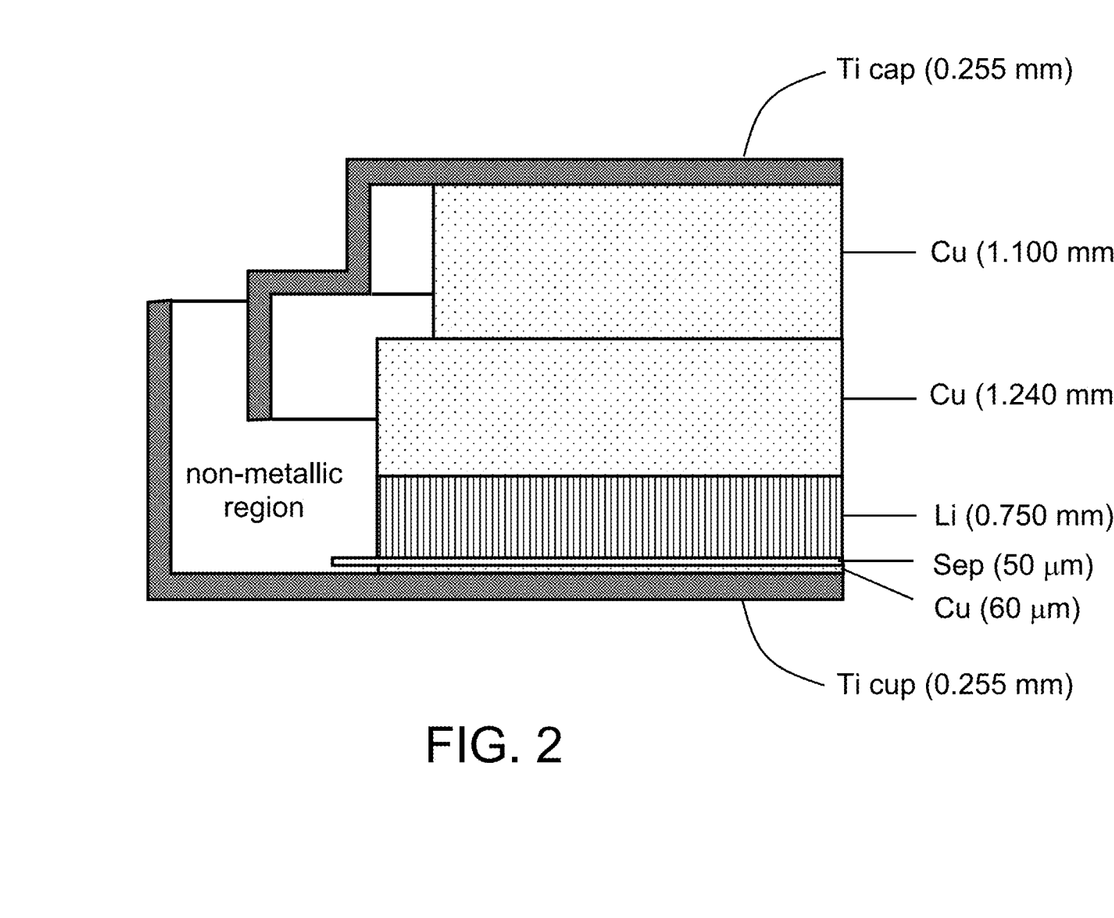
FIG. 2 is a schematic illustration of a coin cell battery used in the magnetic $B_1$ field simulations. The labels show the material and thickness of the simulated layers. The diameter of the lower bottom titanium cup rim and upper top titanium cap rim are 20.163 mm and 16.556 mm, respectively. The electrically insulating separator layer, modeled as polypropylene, is designated by "Sep".
Figure 3A:
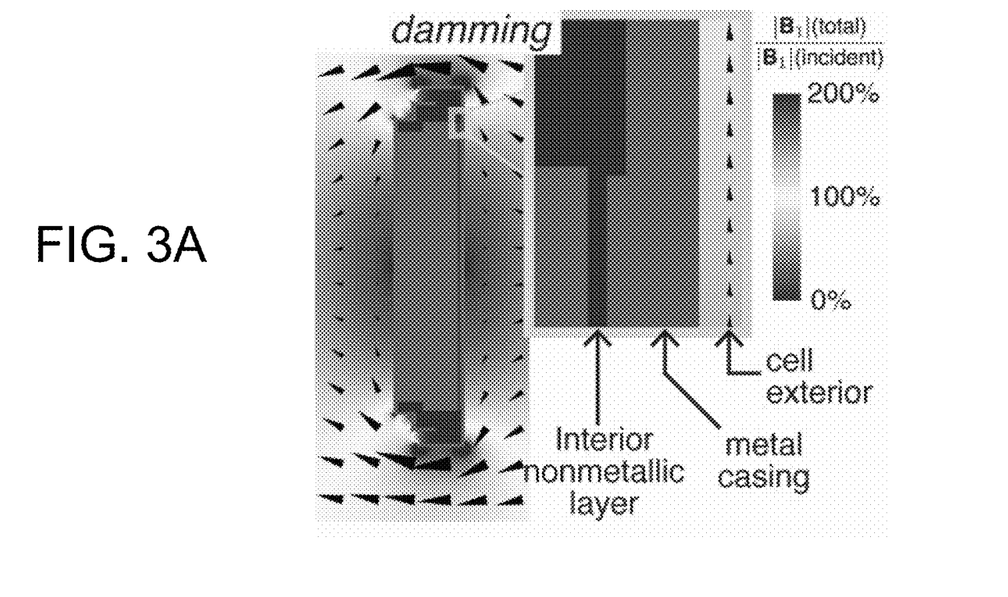
FIG. 3A shows a simulation of the total magnetic $B_1$ field (sum of incident and induced fields) along the central cross section of a coin cell model with $B_1$ applied parallel to the cylindrical symmetry axis of the cell in a "damming" orientation.

This solution works because the degree to which a piece of metal reduces the rf field outside of the metallic bulk depends on geometry. See J. D. Jackson, *Classical Electrodynamics*, 3$^{rd}$ edition (Wiley, 1998). FIG. 2 illustrates a simulated coin cell subject to an incident oscillating magnetic field (similar to the TiTC-II test cell described below and shown in FIG. 5B). Simulations were performed for the coin cell in two different orientations to the incident $B_1$ field. The simulated frequency of the $B_1$ field was 155.45 MHz. The resulting fields, $B_1$, are plotted in FIGS. 3A and 3B. When the coin cell is oriented with cylindrical symmetry axis parallel to the incident $B_1$, as in FIG. 3A, a "$B_1$ damming" effect occurs whereby the rf magnetic field over a large region outside of the disk is attenuated (red regions). The field is also fully eliminated inside the cell, including the narrow interior nonmetallic layer as shown in the inset of FIG. 3A. This layer represents the separator ("Sep"), where most chemical and physical changes relevant to battery function and health take place in a real coin cell. A nonzero $B_1$ field is required for NMR spectroscopy, so in this configuration the separator layer is NMR silent.

Figure 3B:
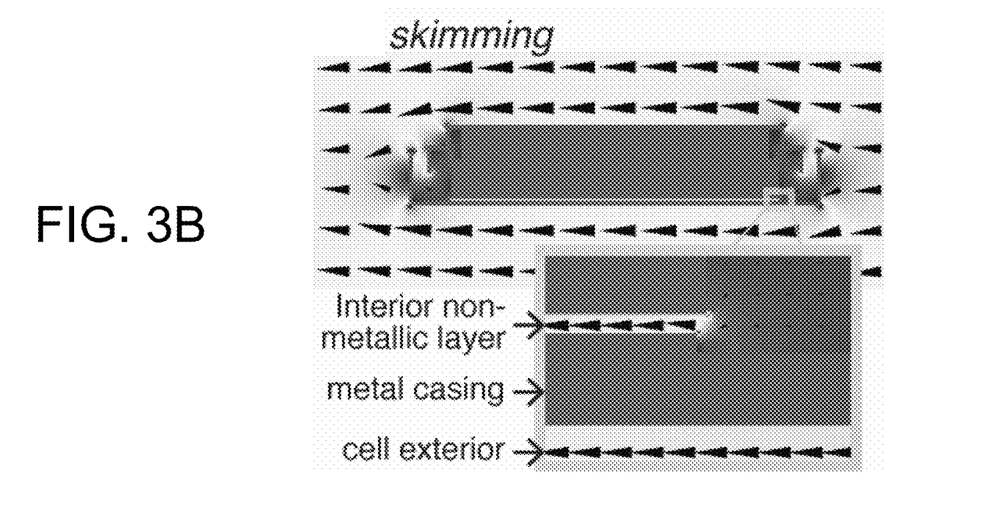
FIG. 3B shows a simulation with $B_1$ applied perpendicular to the cylindrical symmetry axis of the cell. The incident rf field is spatially uniform, harmonic, and applied tangentially in a "skimming" orientation. Arrowheads represent the magnitude relative to that of the incident field (via size) and direction of the total $B_1$ field, color represents magnitude only. Metallic regions are dark gray. The insets (light borders) zoom near the thin interior nonmetallic ("Sep") layer of the cell.

By rotating the cell 90°, the "damming" orientation is turned into a "skimming" orientation, as shown in FIG. 3B. Not only does the exterior $B_1$ remain undiminished right up to the flat faces of the cell, but $B_1$ efficiently penetrates into the interior nonmetallic layer as shown in the inset of FIG. 3B. In the skimming orientation, the coin cell is amenable to chemically relevant NMR spectroscopy (to affect resonance, the component of the rf magnetic field perpendicular to the static $B_0$ field should also be maximized)

Note the importance of the nonmetallic region that prevents the two pieces (cup and cap) of the metal casing from coming into direct electrical contact. A complete metallic casing would eliminate the $B_1$ field within the cavity for all cell orientations but would also short the cell. Therefore, such a casing will not be encountered in a real cell. In general, batteries where the casings and internal metal components are thin, flat, and buffered by nonmetallic regions will best allow B-field penetration when the applied rf magnetic field is incident upon the thin edges. This is expected to include many pouch and prismatic cell types, in addition to coin cells. For long cylindrical cells, where a metal jacket encloses the entire cell except for a top gasket, $B_1$ damming will occur in all orientations.

Single Resonance Rf Tuned Circuit

Figure 4A:
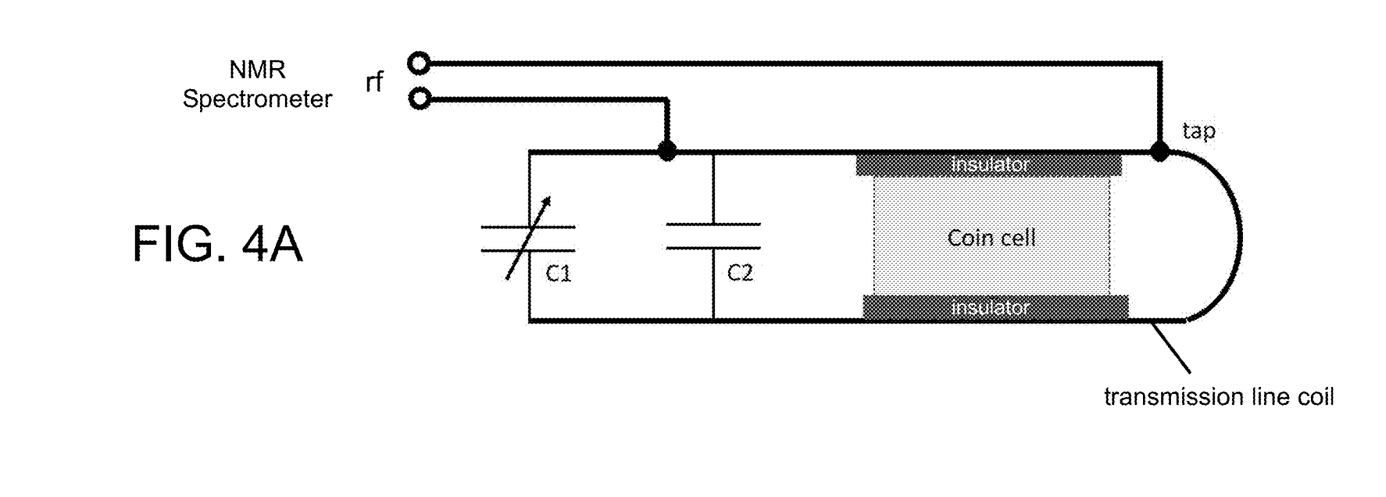
FIG. 4A is a diagram showing a rf tuned circuit for a single frequency mode. The NMR transmission line coil can be a strap of copper with a hairpin bend. For example, a coin cell, wrapped in insulating tape, can slip into the coil. Matching to 50 ohms can be done by adjusting the location of the tap on the coil.

A tuned circuit can be used to efficiently couple the rf pulse of an NMR spectrometer to a transmission line coil with an inserted coin cell. A simple tuned circuit for a single resonance frequency mode can be constructed using a fixed capacitor C2 and tuning capacitor C1, as shown in FIG. 4A. The circuit can be designed to tune to a wide range of frequencies allowing the analysis of different NMR active nuclei. These include, but are not limited to, $^1$H, $^2$H, $^3$H, $^6$Li, $^7$Li, $^{10}$B, $^{11}$B, $^{13}$C, $^{15}$N, $^{19}$F, $^{23}$Na, $^{25}$Mg, $^{27}$Al, $^{31}$P, $^{51}$V, $^{17}$O and $^{133}$Cs. The 50 ohm coaxial cable from the NMR spectrometer can be matched by the tuned circuit to the transmission line coil by locating a tap on the coil at the correct location. The match can be tuned by slightly changing the position of the tap. Near the rf coil, a small diameter insulated coax can be used. This method can be thought of as a step-down autotransformer, to go from the high impedance of the parallel tuned circuit, down to 50 ohms.

Example: Test Coin Cells

Figure 5A:
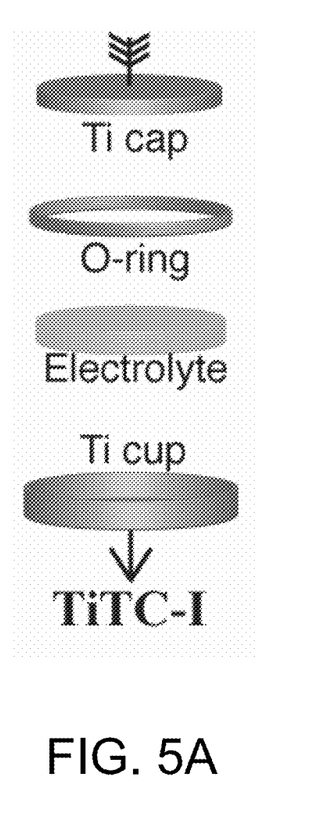
FIGS. 5A and 5B are schematic illustrations of two titanium NMR test cells, TiTC-I and TiTC-II, respectively, constructed in a 2032 coin cell form factor.
Figure 5B:
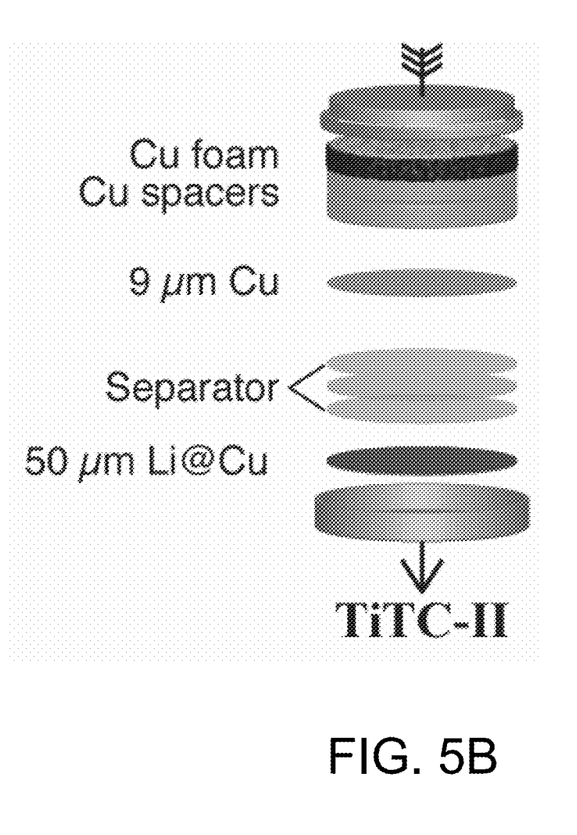

FIGS. 5A and 5B illustrate configurations for two exemplary test coin cells: a fluid-filled dummy cell (TiTC-I) and a lithium half cell (TiTC-II). TiTC-II is capable of electrochemically stripping and plating Li metal. To construct these exemplary test cells, electrolyte solution was prepared by dissolving lithium(bisfluorosulfonyl)imide (LiFSI) into anhydrous 1,2-dimethoxyethane at a molar ratio of 1:1.4 to reach a 4 M concentration. Residual water was minimized by application of vacuum to the LiFSI at 120° C. and drying the solvent over activated alumina prior to use. A total of 1 mL of 4 M LiFSI was added to the Ti cup of TiTC-I but an excess 0.4 mL was squeezed out during assembly. Titanium casings for the nonmagnetic test cells were custom made. The titanium test cells were constructed in an argon filled glove box to limit further exposure to water ($H_2O$<0.2 ppm) and oxygen ($O_2$<0.2 ppm). A polypropylene O-ring maintains an insulating gap between the titanium cup and cap when the cell is assembled.

Figure 4B:
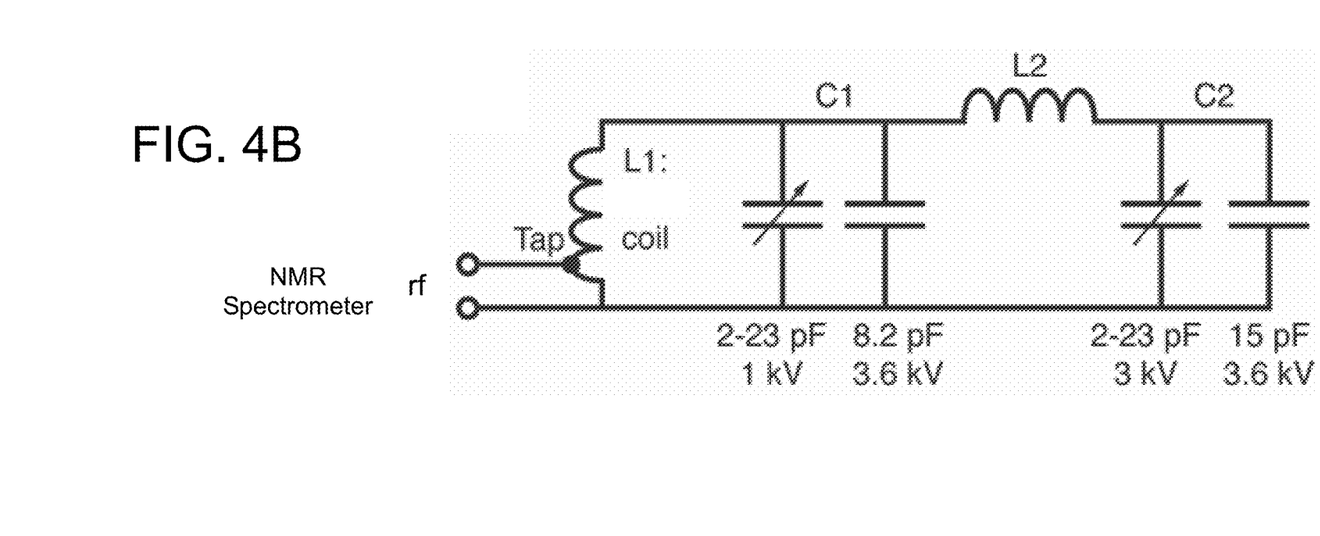
FIG. 4B is a diagram of a double resonance circuit for tuning a low frequency mode (roughly a series circuit of L1, L2, and C2) and a high frequency mode (roughly a parallel resonance of L1, L2, and C1). The match to 50 ohms is provided by one tap point on the coil inductor L1.

NMR signals from material inside these test coin cells was observed using a conventionally tuned double resonance probe circuit with an external hairpin coil, forming a folded ribbon resonator, into which the test cell (wrapped in tape) was inserted in the skimming orientation. $^7$Li (nuclear spin I=3/2) and $^{19}$F (I=1/2) NMR signals were recorded from material inside these coin cells at a static magnetic field of 9.4 T where the corresponding Larmor frequencies are 155.53 MHz and 376.52 MHz, respectively. As shown in FIG. 4B, the circuit was implemented as a basic double resonance design featuring two capacitive elements (C1, C2) and two inductive elements (L1, L2), leveraging principles for efficient tuned circuit design. See M. S. Conradi and A. P. Zens, *J. Magn. Reson.* 292, 53 (2018). The capacitive elements are fixed in parallel with a trimmer. The fixed elements of C1 and C2 were chip capacitors rated at 3.6 kV with capacitances of 8.2 pF and 15 pF, respectively. The trimmers could be adjusted between 2 pF and 23 pF with the C1 trimmer rated at 1 kV and the C2 trimmer rated at 3 kV. C1 was adjusted to set the high frequency mode at 376.52 MHz while C2 determined the low frequency mode at 155.53 MHz (i.e., C2>C1). The high-frequency mode essentially has L1 and L2 in parallel (C2 is nearly a short (zero impedance) at high frequency), being tuned by C1. The low-frequency mode essentially has L1 and L2 in series (C1 is nearly an open circuit (infinite impedance) at low frequency), series resonated by C2. L1 and L2 were both approximately 10 nH. The inductor L1 was a folded ribbon resonator, which was constructed by folding a strap of copper 12.5 mm wide and 0.85 mm thick into a hairpin configuration with a gap height averaging about 5.5 mm. The folded ribbon resonator enables easy and consistent coin cell alignment, stronger $B_1$ amplitudes, better filling factors, and better power handling than a conventional solenoid radiofrequency coil. However, other transmission line coil configurations that provide good filing factors and enable a skimming orientation, such as a flattened solenoid coil, can also be used. L2 is an idler inductor of two turns. Matching to 50Ω was achieved through selection of the tap point on the ribbon inductor L1. The same tap point was found to adequately match the resonator at the $^7$Li and $^{19}$F Larmor frequencies. This tap thus comprises the feed point for a single coaxial cable connection drawn to the bottom of the probe in service of both channels.

For separate (sequential) use of the two modes, as was used in the work described herein, operation is trivial. For simultaneous operation (for example, high-frequency mode decoupling while observing the low-frequency mode), a rf filtering network can be used outside the probe into the spectrometer connections. This filter network can be a combiner/splitter box, with one connection to the low-frequency spectrometer channel, a second connection to the high-frequency spectrometer channel, and a unified port connecting to this double resonance probe. Using passive filters the nucleus pairs [Nucleus_1, Nucleus_2] preferably have observed frequencies >10 MHz apart for signal separation. In addition to [$^{19}$F, $^7$Li], NMR active nucleus pairs can include (but are not limited to) [$^1$H, $^7$Li], [$^1$H, $^6$Li], [$^{19}$F, $^6$Li], [$^1$H, $^{31}$P], [$^{19}$F, $^{31}$P], [$^1$H, $^{11}$B], [$^{19}$F, $^{11}$B], etc. The incorporation of active filtering modules will allow nuclei pairs with closer frequencies to be obtained using this dual tuned circuitry. A single triple tuned (3 distinct nuclei) rf circuit design follows directly.

Electrochemistry is driven by DC circuitry attached to the cell electrodes. Isolation of the rf probe and DC circuitry is a simple matter of ensuring the metal coin cell casing and DC wire leads do not touch the ribbon resonator. To this end, the coin cell was wrapped in an insulating material (e.g., polyvinyl chloride (PVC) electrical tape) except (when operando NMR is desired) for a small exposed region. A small nylon connector clip was fabricated which pressed small wires (0.025 mm diameter) into firm contact with the exposed coin cell electrodes. Wires for the DC charge/discharge path were carried out through the bottom of the probe to connect to a potentiostat or battery cycler. A set of rf chokes and bypass capacitors was used to keep rf away from the DC connections. All elements were mounted on a circuit board and housed in a wide bore (89 mm outer canister diameter) probe, with the ribbon coil located at a height placing the sample firmly within the uniform "sweet spot" region of the static field generated by the 9.4 T superconducting magnet of the NMR spectrometer. Attempts to shim the static field homogeneity on a test cell yielded only marginal improvements in spectral resolution.

All NMR experiments were carried out at a static field ($B_0$) near 9.4 T generated by a Bruker Ascend 400WB magnet using an Avance III HD spectrometer. The dual resonance $^{19}$F/$^7$Li probe circuit was tuned by adjusting the C1 and C2 trimmers. The canister head was removed to expose the trimmers for tuning adjustment. Tuning changes were gauged using the Bruker wobble curve after replacing the canister head and applying several high power (≥150 W) pulses of 150 μs duration or greater. This process was iterated until the targeted resonant frequencies were established. The $^7$Li and $^{19}$F transmitter powers for pulses in all experiments were 360 W and 40 W, respectively.

Figure 6:
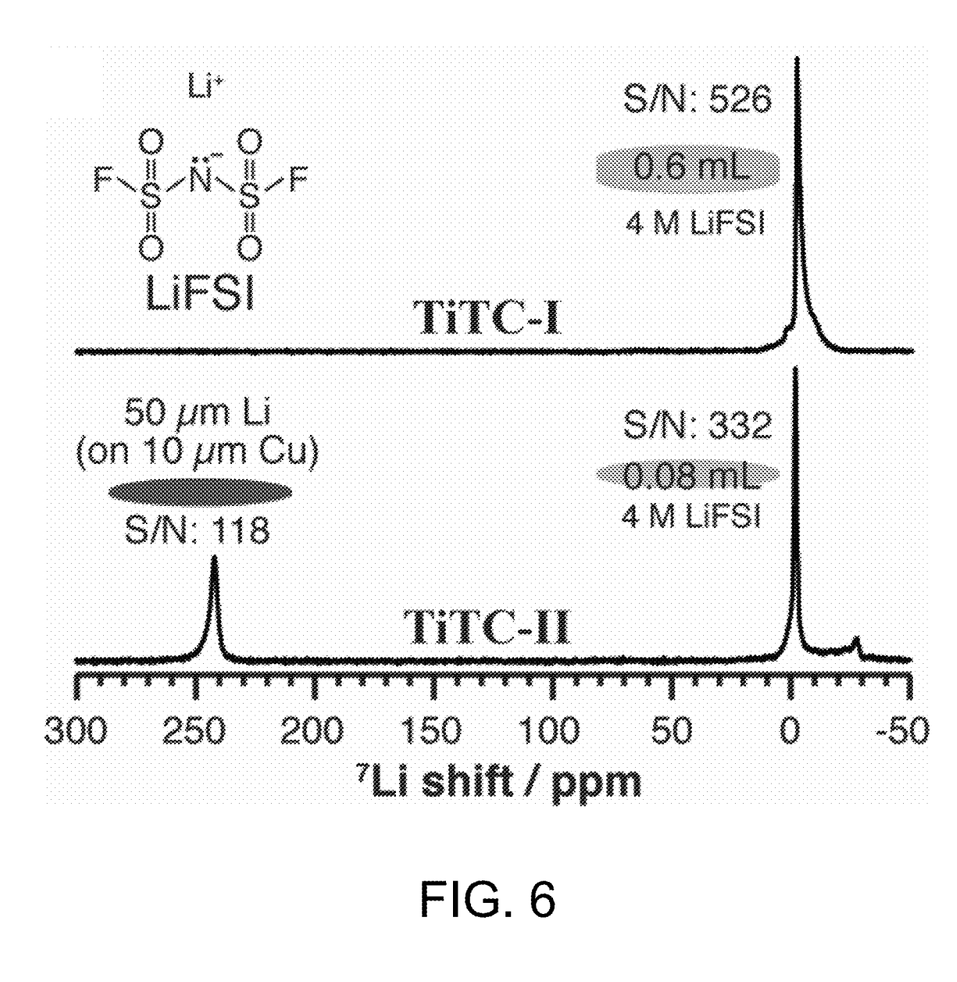
FIG. 6 shows experimental $^7$Li NMR spectra of the test cells TiTC-I and TiTC-II. Each spectrum was acquired in just 33 s with 64 scans.

FIG. 6 shows $^7$Li NMR signals from the lithiated components sealed inside the TiTC-I and TiTC-II cells. The sensitivity is excellent; the S/N of $^7$Li NMR signals from the lithium electrolyte (LiFSI, −2 ppm) and the thin lithium metal foil (for TiTC-II, 242 ppm) both exceed 10 after a single scan. Even though TiTC-I contains around eight times as much electrolyte as TiTC-II, the S/N of the electrolyte in the latter cell is only about 40% lower. This is explained by lower $B_1$ field amplitude in TiTC-I, reducing the excitation and detection efficiency. See D. I. Hoult and R. E. Richards, *J. Magn. Reson.* 24, 71 (1976). The $B_1$ amplitude was quantified by measuring the nutation of $^{19}$F NMR signals from the electrolyte, where the nutation frequency is proportional to $|B_1|$. $^{19}$F nutation frequencies of 4.9 kHz and 11.2 kHz were measured for TiTC-I and TiTC-II, respectively. The $^{19}$F NMR signal of a reference solution of aqueous LiF enclosed in a nonmetallic (zirconia) container nutates at 18.9 kHz, indicating that the incident $B_1$ field is reduced within both cells but is evidently still useable. Compared to the functional cell TiTC-II, the $B_1$ amplitude in TiTC-I is reduced by an additional factor that is greater than two. The $B_1$ amplitude enhancement of functional cells is a phenomenon that is also observed with other coin cells.

Example: COTS Coin Cell

The present invention was applied to an in operando $^7$Li NMR experiment of an unmodified commercial off-the-shelf (COTS) coin cell battery. The LiAl/MnO$_2$ COTS 2016 cells were purchased from an online retailer. Ex situ XRD and the product data sheet suggest a rechargeable chemistry with a β-lithium aluminide (β-LiAl) anode and prelithated cathode based on manganese dioxide (MnO$_2$). See R. A. Guidotti and P. J. Masset, *J. Power Sources* 183, 388 (2008); T. Nohma et al., *J. Power Sources* 26, 389 (1989); and T. Nohma et al., *J. Power Sources* 32, 373 (1990). Three electrochemical cycles on the loaded cell were carried out in the NMR magnet. For each charging or discharging stage, the cell was driven by a steady DC current of ±1.500 mA (target rate C/20) until cutoff voltages of 2.0 V (discharging) or 3.1 V (charging) were reached. Upon attaining a given voltage threshold the voltage would be maintained for 60 s before proceeding to the next stage. Using several pulse sequences that select for specific $^7$Li NMR signals based upon NMR frequency and relaxation, the evolution of several lithium species during the cell's first three cycles was monitored: elemental lithium metal (Li$^0$), β-LiAl, and the phases formed by the uptake of Li$^+$ ions by the prelithiated MnO$_2$ cathode (Li$_x$Mn$_y$O$_z$). See N. M. Trease et al., *Solid State Nucl. Magn. Reson.* 42, 62 (2012); H. E. Schone and W. D. Knight, *Acta Metall. Mater.* 11, 179 (1963); and L. Zhou et al., *J. Magn. Reson.* 234, 44 (2013). These $^7$Li NMR signals are shown in their respective columns in FIG. 7. For all $^7$Li NMR signals, the nutation rate exceeded 10 kHz under the experimental conditions. No NMR signal corresponding to $^7$Li$^+$ in the electrolyte could be definitely assigned; these signals are likely suppressed in the COTS coin cell due to very efficient $^7$Li NMR relaxation induced by Mn$^{2+}$ dissolved in the electrolyte solution. See A. J. Pell et al., *Prog. Nucl. Mag. Res. Sp.* 111, 1 (2019). From the operando NMR signal intensities it can be seen that, as expected, the discharge behavior is dominated by delithiation of β-LiAl (forming Al) and lithation of the MnO$_2$ cathode. This behavior is reversed upon charging. The intensity of the Li$^0$ NMR signal is very weak relative to β-LiAl and essentially constant during cell operation, implying that a small amount of elemental lithium failed to alloy with Al and is electrochemically inactive in this cell (minor intensity changes of the Li$^0$ signal result from incomplete suppression of (out-of-phase) β-LiAl signal).

Figure 7:
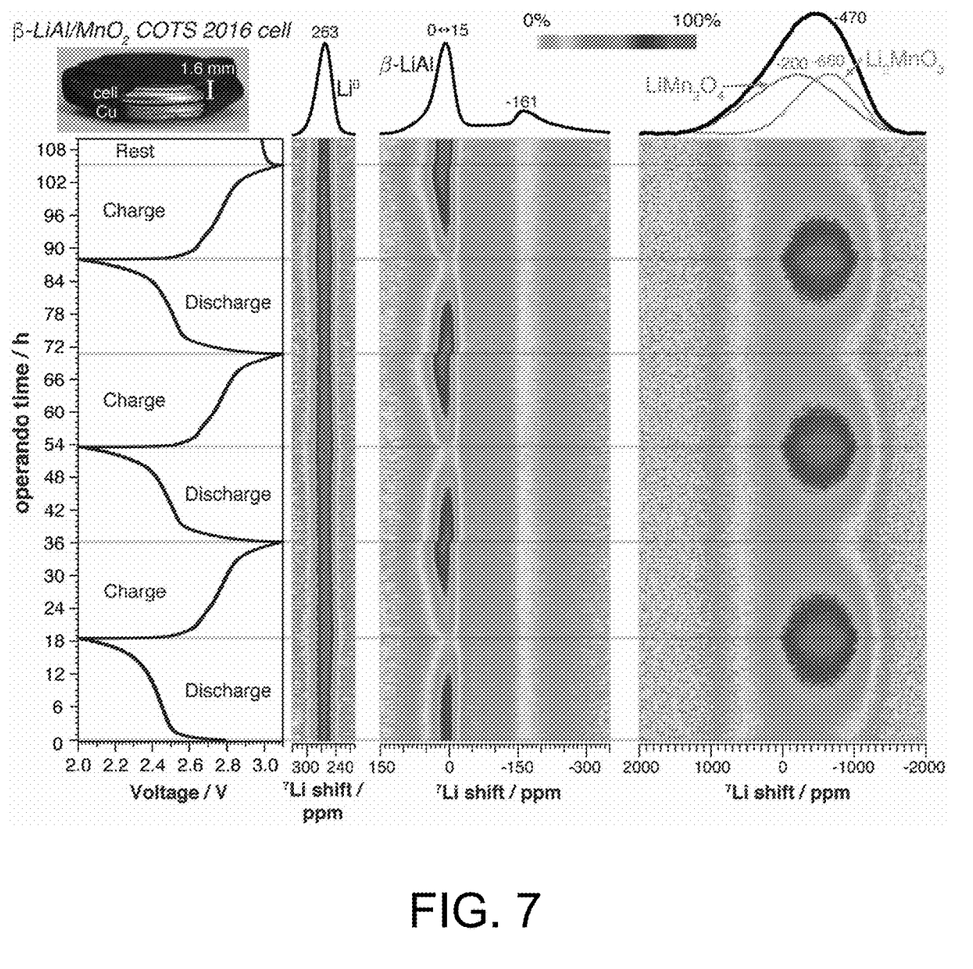
FIG. 7 shows lithium-7 in operando NMR of the first three electrochemical cycles of a β-LiAl/MnO$_2$ rechargeable commercial off-the-shelf (COTS) 2016 coin cell (pictured upper left, shown with Cu shims and insulating tape allowing the cell to be mounted in the NMR probe). The four columns plot the following measurements against the same operando time axis (vertical), from left to right: voltage, Li$^0$, β-LiAl, and cathode $^7$Li NMR signals (note varying horizontal scales). Representative one-dimensional $^7$Li NMR spectra are plotted above their respective columns (decomposed into two signals for the rightmost column). Assignments and chemical shift maxima (in ppm) are also shown.

The signals of Li$^0$ and β-LiAl are based near the interface of the separator layer and are visible, despite the electrical conductivity of these phases, due to the skin depth effect. The electrical conductivity of the metallic components in a real cell is not really infinite. An oscillating field applied tangentially to a large flat metal boundary penetrates into the metal with an exponentially decaying amplitude as a function of penetration depth. In this case the decay constant is given by the skin depth, d, $$d = \sqrt{\frac{2}{\mu \sigma \omega_0}}.$$

where μ is the magnetic permeability, σ is the electrical conductivity, and wo is the angular frequency of the oscillating rf field. This permits observation of elemental Li$^0$ and β-LiAl $^7$Li NMR signals despite good electrical conductivity of the host phase. Approximating p to be the vacuum permittivity, and given electrical resistivities of $\sigma^{-1}$=2.65·10$^{-8}$ Ω·m (Al$^0$ at 293 K), $\sigma^{-1}$=9.28·10$^{-8}$ Ω·m (Li$^0$ at 293 K), and $\sigma^{-1}$=4.58·10$^{-7}$ Ω·m (β-LiAl at 290 K), the corresponding skin depths at $\omega_0/(2\pi)$=155.5 MHz are d=6.6 μm (Al$^0$), 12.3 μm (Li$^0$), and 27.3 μm (β-LiAl). See W. Haynes, *CRC Handbook of Chemistry and Physics, 95$^{th}$* edition (CRC Press, 2014); and L. N. Hall et al., *Solid State Commun.* 48, 547 (1983). Note that the resistivity of β-LiAl near room temperature has been measured to vary between 2·10$^{-7}$ Ω·m and 10·10$^{-7}$ Ω·m depending on the exact Li:Al ratio. See L. N. Hall et al., *Solid State Commun.* 48, 547 (1983).

Figure 8:
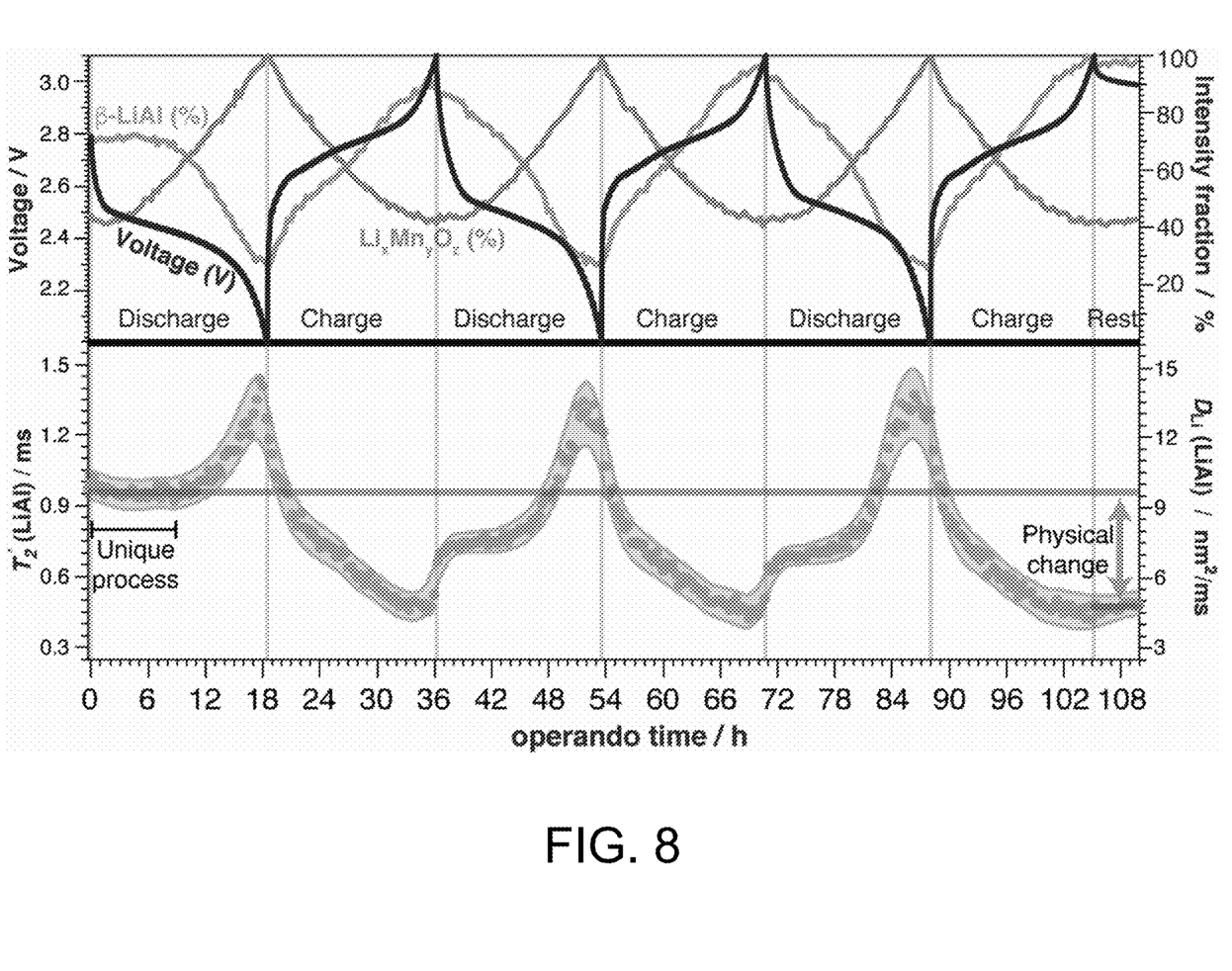
FIG. 8 shows changes in molecular-level properties of the COTS cell during its first three electrochemical cycles, as measured by NMR. Top row: Integrated intensities (right axis) of the active β-LiAl anode and Li$_x$Mn$_y$O$_z$ cathode $^7$Li NMR signals, response axis at right, overlaid with the chronopotentiogram (left axis). Bottom row: Diffusivities of lithium ions in the β-LiAl anode (Du, right axis) derived from the transverse relaxation parameter $T_2'$, (left axis), as measured in a two-pulse echo experiment. A vacancy hopping model for β-LiAl relates the two parameters by $D_{Li}$= $(10.1$ nm$^2$/ms$^2)T_2'$. See H. E. Schone and W. D. Knight, *Acta Metall.* 11, 179 (1963); and T. Tokuhiro et al., *J. Phys. Soc. Japan* 58, 2553 (1989). The shaded band corresponds to smoothed asymptotic standard errors on $T_2'$.

The chemical specificity of the operando NMR experiment enables previously unknown molecular-level details pertaining to the physical and chemical changes that occur during electrochemical cycling. FIG. 8 shows that the active β-LiAl $^7$Li NMR signal is particularly revealing in this regard. For the first 9 h, the β-LiAl anode NMR signal intensity does not change, despite a significant increase in the measurable quantity of Li$^+$ in the MnO$_2$ cathode. This initial β-LiAl inactivity is also reflected in $T_2'$ relaxation measurements made during the same operando experiment, suggesting an initial irreversible process uniquely affects the first discharge of the COTS cell. The $T_2'$ parameter, which can be seen from FIG. 8 undergoes large changes during cycling, is a sensitive reporter of lithium dynamics, and suggests that lithium diffusivity in the anode increases at low states of charge. See L. Zhou et al., *Angew. Chem. Int. Edit.* 54, 14782 (2015). After three full cycles, the open circuit voltage of the resting cell gradually falls from 3.1 V to below 3.0 V (see right edge of FIG. 8). Neither β-LiAl NMR signal intensity nor $T_2'$ change significantly during this resting period, yet both parameters attain final values which are significantly different than that of the pristine β-LiAl. These observations indicate the anode accumulates physical changes as it is cycled, likely involving the evolution of β-LiAl microstructure.

This COTS cell is slightly ferromagnetic. The magnetic forces were weak enough that the tape-wrapped cell, when wedged between the strips of the hairpin coil, remained secure as it was inserted into the 9.4 T NMR magnet. Magnetic forces could also affect electrochemistry. See B. F.

Gomes et al., *Anal. Chem.* 86, 9391 (2014). A reference cell from the same purchase package was cycled outside of the NMR magnet to check this. The shape of their chronopotentiograms are essentially identical, suggesting that the strong static field is not modifying the electrochemical behavior of this cell.

The present invention has been described as a probe for operando in situ electrochemical NMR spectroscopy. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A probe for operando in situ electrochemical nuclear magnetic resonance spectroscopy, comprising:
    a transmission line coil comprising two anti-parallel planar conductors for inserting an electrochemical cell therebetween, the electrochemical cell comprising substantially planar parallel electrodes with an electrically insulating gap therebetween, wherein the transmission line coil is configured to apply a rf magnetic field tangentially to the parallel electrodes of the electrochemical cell when a pulsed rf excitation signal from an NMR spectrometer is applied to the transmission line coil, thereby allowing the rf magnetic field to at least partially penetrate into the gap; and
    a tuned circuit for matching the pulsed rf excitation signal from the NMR spectrometer to the transmission line coil.

2. The probe of claim 1, wherein the electrochemical cell comprises a battery, fuel cell, supercapacitor, or electrochemical sensor.

3. The probe of claim 2, wherein the battery comprises a coin cell, pouch cell, or prismatic cell battery.

4. The probe of claim 1, wherein the transmission line coil comprises a folded ribbon resonator.

5. The probe of claim 1, wherein the transmission line coil comprises a flattened solenoid coil.

6. The probe of claim 1, wherein the gap comprises an electrolyte.

7. The probe of claim 1, wherein the gap comprises a separator.

8. The probe of claim 1, wherein the penetrating rf magnetic field excites one or more NMR active nuclei in the gap of the electrochemical cell.

9. The probe of claim 8, wherein the one or more NMR active nuclei comprises $^{1}$H, $^{2}$H, $^{3}$H, $^{6}$Li, $^{7}$Li, $^{10}$B, $^{11}$B, $^{13}$C, $^{15}$N, $^{19}$F, $^{23}$Na, $^{25}$Mg, $^{27}$Al, $^{31}$P, $^{51}$V, $^{17}$O, or $^{133}$Cs.

10. The probe of claim 1, wherein the tuned circuit comprises a double resonance circuit.

11. The probe of claim 10, wherein the double resonance circuit tunes a low-frequency mode and a high-frequency mode of a pair of NMR active nuclei.

12. The probe of claim 11, wherein the pair of NMR active nuclei comprises [$^{1}$H, $^{7}$Li], [$^{1}$H, $^{6}$Li], [$^{19}$F, $^{6}$Li], [$^{19}$F, $^{7}$Li], [$^{1}$H, $^{31}$P], [$^{19}$F, $^{31}$P], [$^{1}$H, $^{11}$B], or [$^{19}$F, $^{11}$B].

* * * * *